(12) United States Patent
Liao et al.

(10) Patent No.: US 7,967,184 B2
(45) Date of Patent: Jun. 28, 2011

(54) PADLESS SUBSTRATE FOR SURFACE MOUNTED COMPONENTS

(75) Inventors: Chih-Chin Liao, Changhua (TW); Ken Jian Ming Wang, San Francisco, CA (US); Han-Shiao Chen, Da-an Township, Taichung County (TW); Chin-Tien Chiu, Taichung (TW); Jack Chang Chien, Kaoshiung (TW); Shrikar Bhagath, San Jose, CA (US); Cheemen Yu, Madison, WI (US); Hem Takiar, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 387 days.

(21) Appl. No.: 11/280,419

(22) Filed: Nov. 16, 2005

(65) Prior Publication Data

US 2007/0108257 A1 May 17, 2007

(51) Int. Cl.
*B23K 31/02* (2006.01)
(52) U.S. Cl. ............................ 228/180.21; 361/767
(58) Field of Classification Search ............. 228/180.21; 29/832; 361/767
See application file for complete search history.

(56) References Cited

U.S. PATENT DOCUMENTS

| | | | | |
|---|---|---|---|---|
| 5,053,916 | A | * | 10/1991 | Weekamp et al. ......... 361/308.2 |
| 5,729,439 | A | | 3/1998 | Saito |
| 5,920,462 | A | * | 7/1999 | Glovatsky et al. ............ 361/760 |
| 6,040,622 | A | | 3/2000 | Wallace |
| 6,103,554 | A | * | 8/2000 | Son et al. ...................... 438/126 |
| 6,410,355 | B1 | | 6/2002 | Wallace |
| 6,867,504 | B2 | * | 3/2005 | Lichtenwalter et al. ...... 257/779 |
| 2003/0177637 | A1 | | 9/2003 | Seckora |
| 2003/0184986 | A1 | * | 10/2003 | Soga et al. ..................... 361/767 |
| 2005/0189626 | A1 | * | 9/2005 | Xiaochun et al. ............. 257/666 |

FOREIGN PATENT DOCUMENTS

EP 0862217 A 9/1998

OTHER PUBLICATIONS

International Preliminary Report on Patentabilty dated May 29, 2008 in PCT Application No. PCT/US2006/043892.
Taiwanese Office Action dated Dec. 24, 2009 in Taiwanese Application No. 095142304.
Chinese Office Action dated Aug. 27, 2009 in Chinese Application No. 200680042873.2.
Taiwanese Office Action dated Aug. 28, 2009 in Taiwanese Application No. 095142304.
Amended Claims in Response to Chinese Office Action dated Oct. 2009 in Chinese Application No. 2006800428731.
Amended Claims in Response to Taiwanese Office Action dated Nov. 2009 in Taiwanese Application No. 095142304.
Office Action dated May 25, 2010 in Korean Application No. 7014448/2008.
Response to Office Action filed Aug. 24, 2010 in Korean Application No. 7014448/2008.

* cited by examiner

*Primary Examiner* — Jessica L Ward
*Assistant Examiner* — Nicholas P D'Aniello
(74) *Attorney, Agent, or Firm* — Vierra Magen Marcus & DeNiro LLP (57) ABSTRACT

A semiconductor package having a low profile is disclosed. In embodiments, a surface mounted component may be mounted directly to the core of the semiconductor package substrate, so that there is no conductive layer, plating layers or solder paste between the component and the substrate core. The surface mounted component may be any type of component which may be surface mounted on a substrate according to an SMT process, including for example passive components and various packaged semiconductors.

6 Claims, 12 Drawing Sheets

PADLESS SUBSTRATE FOR SURFACE MOUNTED COMPONENTS

BACKGROUND OF THE INVENTION

1. Field of the Invention

Embodiments of the present invention relate to a semiconductor package having a low profile.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate on which the die are mounted may in general include a rigid, dielectric base having a conductive layer etched on one or both sides. The one or more semiconductor die and/or passive components such as resistors, inductors and/or capacitors may be mounted to the substrate by surface mount technology (SMT). SMT is a known method of soldering die and/or surface mounted components to plated portions of conductive layers on the surface of the substrate. The conductive layer(s) provide an electric lead structure for communication between the die, passive components and an external electronic system. Once electrical connections between the surface mounted components and substrate are made, the assembly is then typically encased in a molding compound to form a protected semiconductor package.

Figure 1:
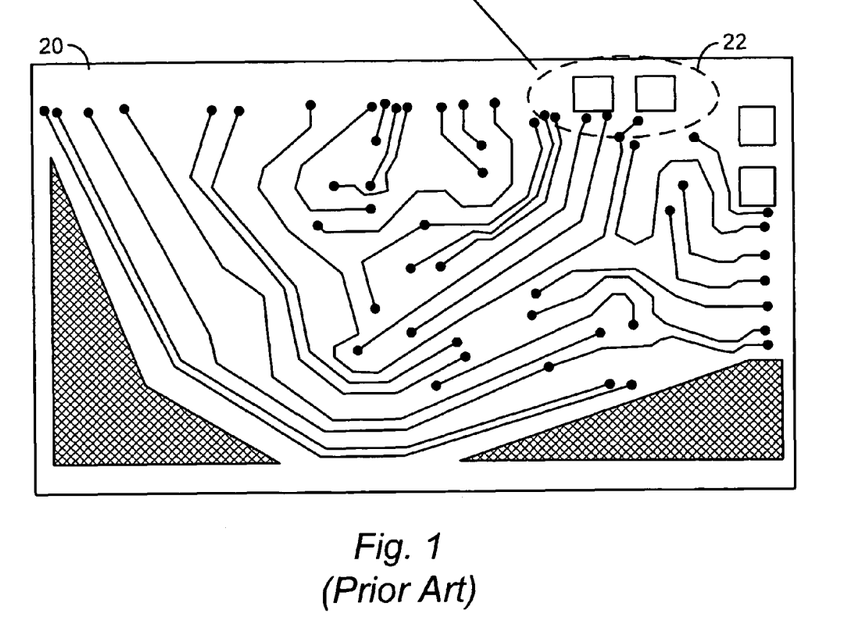
FIG. 1 is a prior art top view of a substrate used in semiconductor packages.
Figure 2:
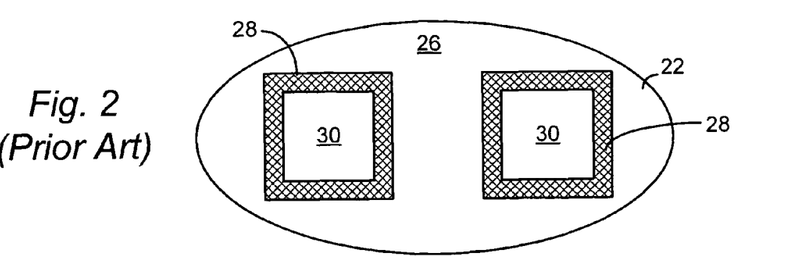
FIG. 2 is a prior art top view of an enlarged portion of the substrate shown in FIG. 1.
Figure 3:
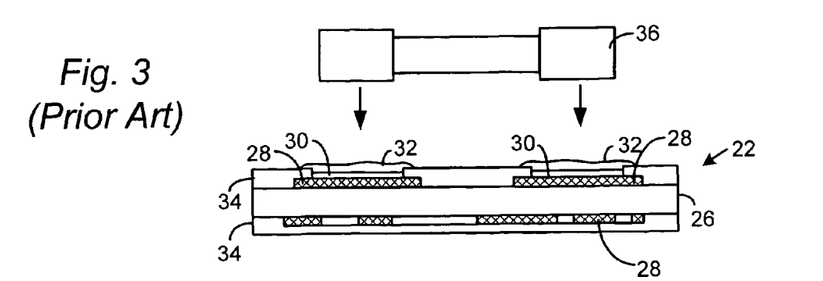
FIG. 3 is a prior art side view of an enlarged portion of the substrate shown in FIG. 1.

FIG. 1 is a top view of a conventional substrate 20 including areas 22 for receiving a component affixed to the substrate in a known SMT process. FIGS. 2 and 3 are enlarged top and side views, respectively, of the substrate area 22. The substrate area 22 in general includes a rigid core 26, of for example polyimide laminate. Thin film conductive layers 28 may be formed on the core in a desired conductance pattern using known photolithography and etching processes. Portions of the conductance pattern may be plated with a thin layer 30 of gold or other highly resistive metal. The substrate area 22 may then be coated with a solder mask 34 (shown only in FIG. 3) to insulate and protect the electrical lead pattern defined on the substrate.

Solder paste 32 may be applied to the plated layer 30, and a component 36 then set atop the solder paste, as indicated in FIG. 3. The solder paste holds the passive component in position while the substrate is heated in a solder reflow process to harden the solder, thereby securing the component 36 to the plated layer 30 and electrically connecting the component to the substrate.

Once the die and/or passive components are mounted to the substrate, the package may be encapsulated in a molding compound to form a finished semiconductor package. The thickness of the encapsulated package may be approximately 0.65 mm, but different packages may have different thicknesses. There is an ever-present drive to decrease the overall dimensions of conventional semiconductor packages, including package thickness. However, if the thickness of the molding compound were reduced in conventional packages, there is a risk of exposing the components mounted to the substrate. In addition to the height of the passive components, the conductance pattern, plated layer and solder paste on which the passive components are mounted all add to the thickness of the semiconductor package. In conventional packages, the conductance pattern, plated layer and solder paste may add approximately 50 microns (μm) to the thickness of a semiconductor package.

SUMMARY OF THE INVENTION

Embodiments of the invention relate to a semiconductor package having a low profile. In embodiments, a surface mounted component may be mounted directly to the core of the semiconductor package substrate, so that there is no conductive layer, plating layers or solder paste between the component and the substrate core. The surface mounted component may be any type of component which may be surface mounted on a substrate according to an SMT process, including for example passive components and various packaged semiconductors.

During fabrication, after positioning a surface mounted component on the bare substrate core, a solder paste may be applied between plating layers and the ends and/or sides of the surface mounted component. Thus, instead of the solder paste being beneath the component as in conventional substrates, the solder paste adheres to the ends and/or sides of an electrical contact or contacts of the component to affix the component on the substrate, and to electrically connect the component to the substrate. After the solder paste is applied, the substrate may be heated in a reflow process to harden the solder and bond the component to the substrate.

The conductance pattern and plating layer may be formed during the photolithography process into a pair of U-shaped structures which face each other so as to define a bare, open space on the substrate for receiving the surface mounted component. The conductance pattern and plating layer may be formed in other configurations, including into generally rectangular-shaped pads on the substrate, spaced apart from each other a distance sufficient to receiving the surface mounted component therebetween.

Mounting a component directly to the substrate core reduces the height of that component above the substrate in comparison to conventional surface mounting techniques, and may allow a reduction in the overall height of the encapsulated semiconductor package formed with the substrate.

DETAILED DESCRIPTION

Embodiments of the invention will now be described with reference to FIGS. 4 through 29, which relate to a semiconductor package having a low profile. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 4:
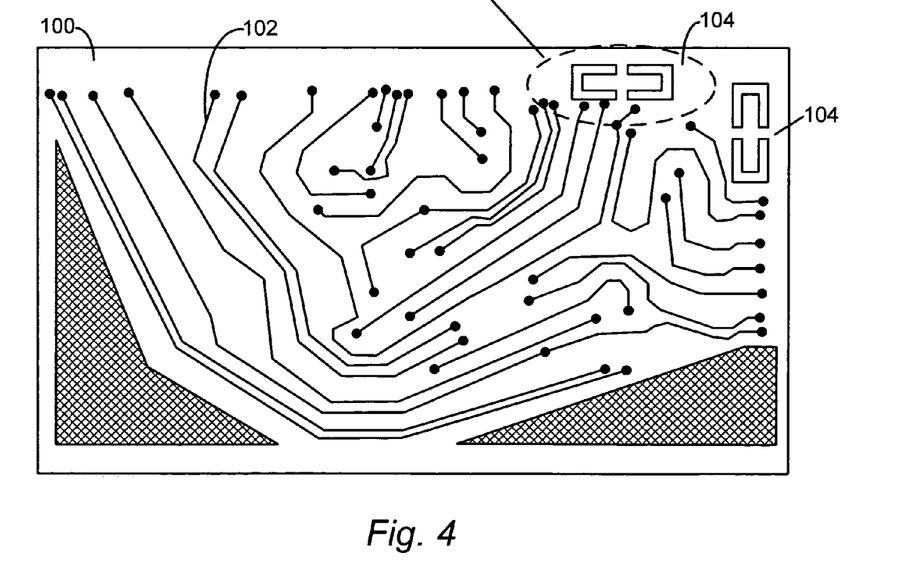
FIG. 4 is a top view of a substrate for receiving components surface mounted to the substrate according to embodiments of the present invention.

FIG. 4 is a top view of a substrate 100 showing a conductance pattern 108 and areas 104 defined in the conductance pattern 108 for receiving components surface mounted to the substrate according to embodiments of the present invention as explained hereinafter. While two areas 104 are shown for receiving such surface mounted components, there may be one such area or more than two such areas in alternative embodiments of the present invention. The areas 104 for receiving components may be located at other locations on the substrate 100 in alternative embodiments.

Figure 5:
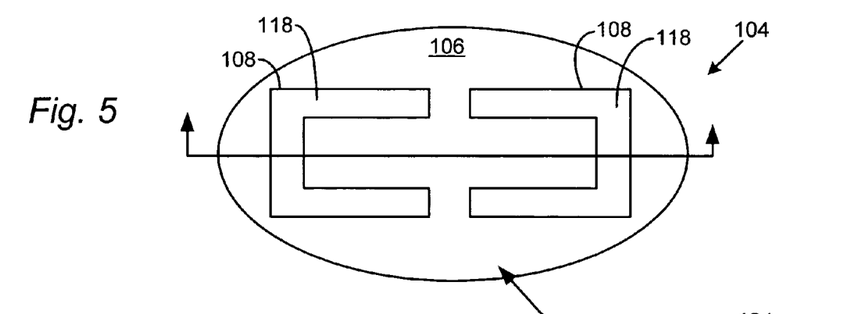
FIG. 5 is a top view of an enlarged portion of the substrate shown in FIG. 4.
Figure 6:
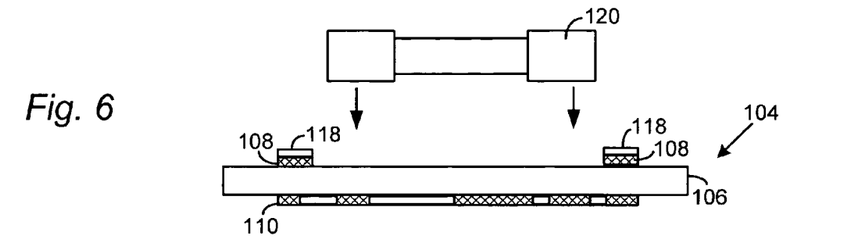
FIG. 6 is a side view of an enlarged portion of the substrate shown in FIG. 4.

FIGS. 5 and 6 are enlarged top and side views, respectively, of the substrate area 104. Substrate 100 may be a variety of different chip carrier mediums, including for example a printed circuit board (PCB). Where substrate 100 is a PCB, the substrate may be formed of a core 106, having the top conductive layer 108 formed on a top surface of the core 106, and a bottom conductive layer 110 formed on the bottom surface of the core 106. The core 106 may be formed of various dielectric materials such as for example, polyimide laminates, epoxy resins including FR4 and FR5, bismaleimide triazine (BT), and the like. Although not critical to the present invention, core 106 may have a thickness of between 40 μm to 200 μm, although the thickness of the core may vary outside of that range in alternative embodiments. The core 106 may be ceramic or organic in alternative embodiments.

The conductive layers 108 and 110 may be formed of copper or copper alloys, plated copper or plated copper alloys, Alloy 42 (42Fe/58Ni), copper plated steel, or other metals and materials known for use on substrates. The layers 108 and 110 may have a thickness of about 10 μm to 24 μm, although the thickness of the layers 108 and 110 may vary outside of that range in alternative embodiments.

Figure 29:
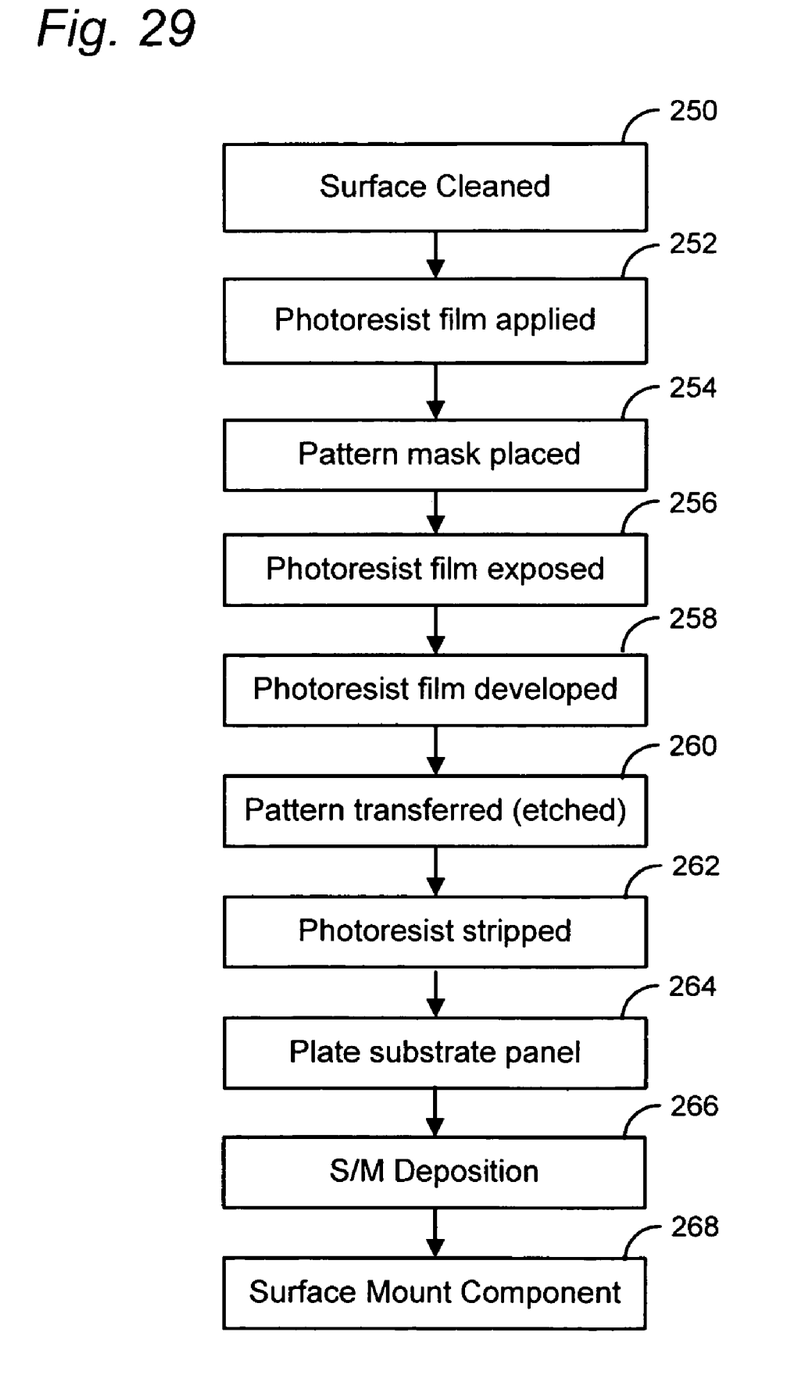
FIG. 29 is a flowchart of a process for forming a substrate according to embodiments of the present invention.

The layer 108 and/or layer 110 may be etched with a conductance pattern for receiving surface mounted components as explained hereinafter, and for communicating signals between one or more semiconductor die and an external device. One process for forming the conductance pattern on the substrate 100 is explained with reference to the flowchart of FIG. 29. The surfaces of conductive layers 108 and 110 are cleaned in step 250. A photoresist film is then applied over the surfaces of layers 108 and 110 in step 252. A pattern mask containing the outline of the electrical conductance pattern may then be placed over the photoresist film in step 254. The photoresist film is exposed (step 256) and developed (step 258) to remove the photoresist from areas on the conductive layers that are to be etched. The exposed areas are next etched away using an etchant such as ferric chloride in step 260 to define the conductance patterns on the core. Next, the photoresist is removed in step 262. Other known methods for forming the conductance pattern on substrate 100 are contemplated.

Once patterned as explained above, one or more layers 118 of gold or other resistive metal may be plated on portions of the conductive layers 108 and/or 110 in step 264. In particular, it may be difficult or impractical to solder directly onto the bare copper conductance pattern. It is therefore known to plate copper leads at solder points where components (such as component 120 shown in FIG. 6) are surface mounted to the substrate, and where wire bond connections with semiconductor die are made. Various plating processes are known for selectively plating a resistive metal onto the conductance pattern, including for example electroplating. In an electroplating process, the substrate 100 is immersed in a plating bath including metal ions in an aqueous solution. A current is supplied to the areas of the conductance pattern to be plated and a charge is created at their surface. The metal ions in solution are attracted to and deposit on the electrified and charged metal areas to create layers 118.

Figure 7:
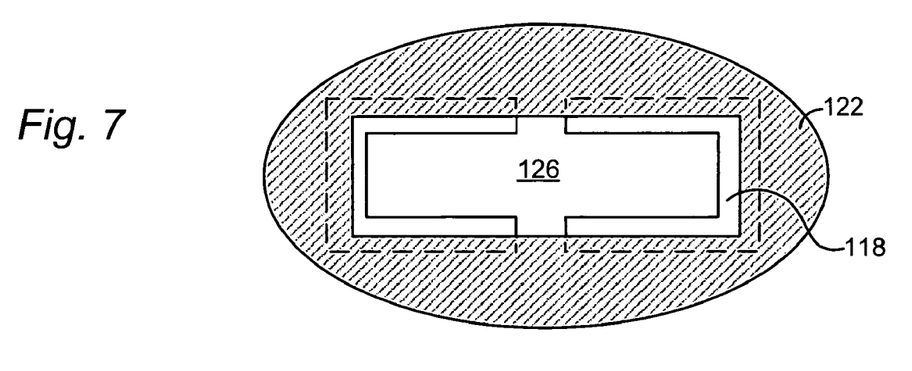
FIG. 7 is a top view of a substrate for receiving components surface mounted to the substrate including a solder mask according to embodiments of the present invention.
Figure 8:
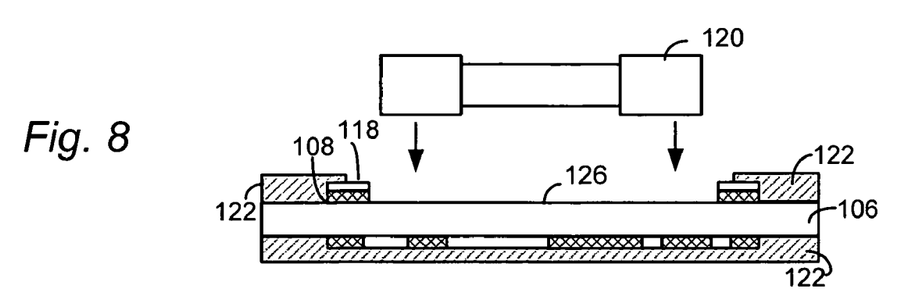
FIG. 8 is a side view of the substrate shown in FIG. 7.

Referring now to the top view of FIG. 7 and side view of FIG. 8, once patterned and plated, the top and bottom conductive layers 108, 110 may be laminated with a solder mask 122 in a step 266 to insulate and protect the conductance pattern defined on the substrate during one or more subsequent soldering processes.

Figure 9:
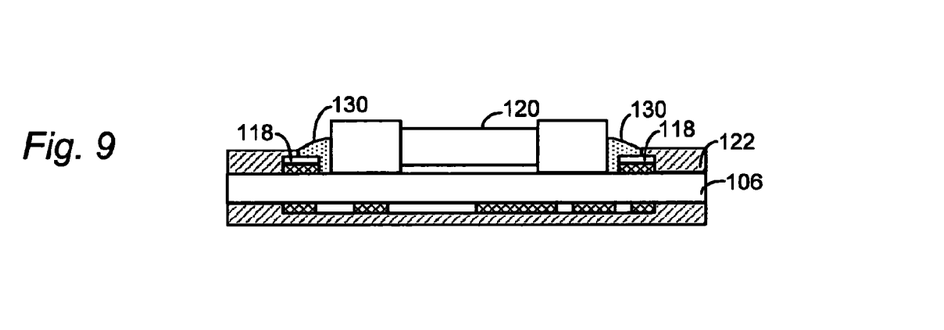
FIG. 9 is a side view of a substrate including a component surface mounted to the substrate according to embodiments of the present invention.
Figure 10:
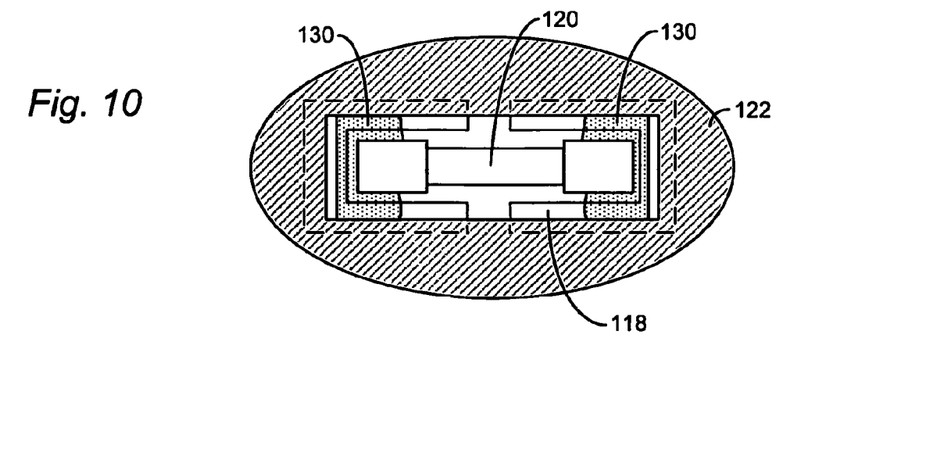
FIG. 10 is a top view of the substrate shown in FIG. 9.
Figure 11:
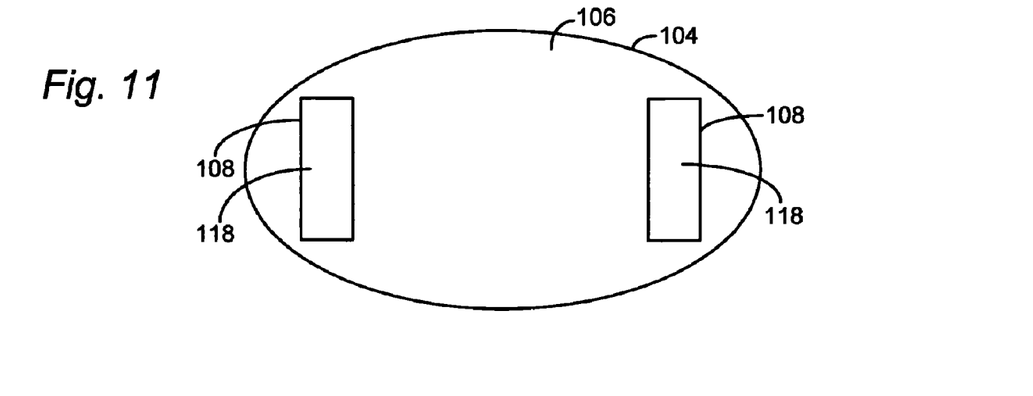
FIG. 11 is a top view of a substrate for receiving components surface mounted to the substrate according to an alternative embodiment of the present invention.
Figure 12:
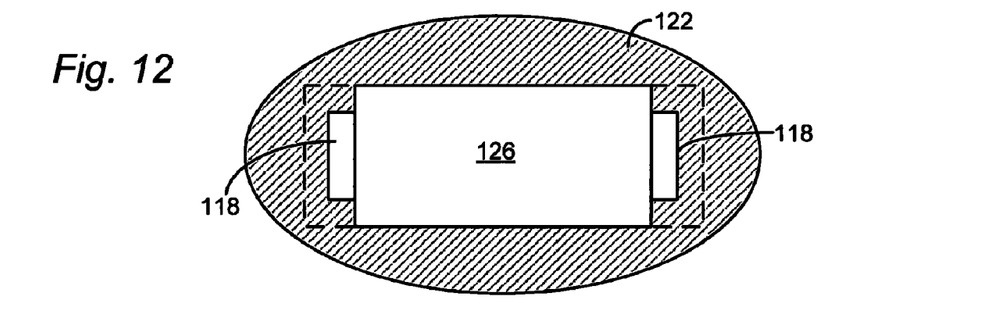
FIG. 12 is a top view of a substrate for receiving components surface mounted to the substrate including a solder mask according to the embodiment of FIG. 11.

Referring now to the side view of FIG. 9 and the top view of FIG. 10, after the solder mask 122 is applied, a component 120 may be mounted to the substrate 100 at area 104 in an SMT step 268. As explained in the Background of the Invention section, such components are conventionally mounted on top of the conductance pattern, one or more plating layers and the solder paste. However, in accordance with embodiments of the present invention, the component 120 may be mounted directly to the core 106 of substrate 100. That is, in embodiments, there is no conductive layer, plating layers or solder paste between the component 120 and core 106.

In particular, a section of the conductance pattern is etched away during the photolithography process described above, thus leaving a bare space 126 (FIGS. 7 and 8) on the core 106 large enough to receive the component 120. As component 120 may vary in size and type as explained hereinafter, the size of the bare space 126 left on the core 106 may vary accordingly in alternative embodiments. However, depending on the size and type of component 120 that is to be mounted on substrate 100, the size of the bare space 126 would be known upon the layout and design of the conductance pattern and may be defined in the photo mask.

Figure 9A:
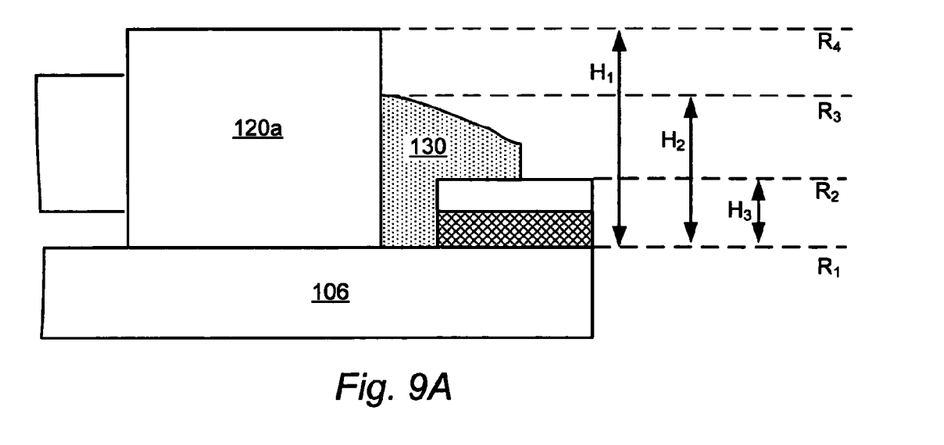
FIG. 9A is an enlarged portion of the side view shown in FIG. 9.

FIG. 9A is an enlarged portion of the side view of FIG. 9. As seen therein, component 120 includes an electrical contact 120a conventionally used to establish electrical communication between component 120 and the substrate. Contact 120a may have different configurations, but in general may have a lowermost position tangent to reference plane $R_1$, and an uppermost position tangent to reference plane $R_4$. The use of "upper" and "lower" is with respect to the view shown in FIG. 9 and used for ease of description. The upper and lower positions may be reversed if for example substrate 100 was flipped upside down. The height $H_1$ may be the height of the electrical contact 120a, which is the distance between reference planes $R_1$ and $R_4$. In embodiments, the plane $R_1$ tangent to the lowermost position may be the upper surface of the core 106 as described above.

The height $H_2$ of the solder paste layer 130 may be the distance between reference plane $R_1$ and a reference plane $R_3$. Similarly, the height $H_3$ of the metal portions—pattern 108 and plated layer 118—may be the distance between reference plane $R_1$ and a reference plane $R_2$. As discussed above, the height above the substrate core 106 of the uppermost position of the electrical contact 120a in conventional designs would be the sum of $H_1$, $H_2$ and $H_3$. However, in accordance with embodiments of the invention, the height of the uppermost position of the electrical contact 120a above core 106 may only be the height of the electrical contact, $H_1$.

In SMT step 268, the component 120 may be placed within the bare space 126. Once positioned, a solder paste 130 may be applied between the gold layer 118 and the ends and/or sides of component 120 as shown in FIGS. 9 and 10. Thus, instead of the solder paste being beneath the component as in conventional substrates, the solder paste 130 adheres to the ends and/or sides of an electrical contact or contacts of the component 120 to affix the component on substrate 100, and to electrically connect the component 120 to the substrate 100. After solder paste 130 is applied, the substrate 100 may be heated in a reflow process to remove flux from the solder paste 130 and harden the solder to bond the component 120 to plated layers 118. It is understood that other electrically conductive materials may be used instead of solder paste to electrically and physically couple component 120 to the substrate 100 in alternative embodiments.

The bare space 126 may be sized to leave boundaries at the ends of the component 120 and/or boundaries at the sides of the component 120. The size of the boundary at either end, and on either side, of component 120 may vary in alternative embodiments. In one embodiment, the boundary at either end of the component 120, and the boundary to either side of component 120, may be between 15 μm and 75 μm, and more particularly, between 20 μm and 50 μm, and more particularly, 25 μm. It is understood that the boundary at the ends and sides of the component 120 may be less than 15 μm and greater than 75 μm in further embodiments.

As shown in FIG. 10, solder paste 130 may adhere to electrical contacts of the component 120 at the ends of the electrical contacts and at the sides of the electrical contacts. However, in alternative embodiments, the solder paste 130 may be applied to only the ends of the electrical contacts of component 120, or only to the sides of the electrical contacts of component 120, to affix and electrically connect the component 120 to the substrate.

In the embodiment shown in FIGS. 5 through 10 and described above, the conductance pattern 108 and plating layer 118 may be formed during the photolithography process into a pair of U-shaped structures which face each other, with the bare space 126 for receiving the component 120 being defined between the U-shaped structures. The width of each portion of both U-shaped structures surrounding the bare space 126 may vary in alternative embodiments, but may for example be between 15 μm and 75 μm wide. It is understood that the width of each portion of both U-shaped structures surrounding the bare space 126 may be less than 15 μm and greater than 75 μm in further embodiments. The U-shaped structures may be electrically connected to other portions of the substrate by electrical traces (not shown) leading away from the U-shaped structures.

Figures 13, 14:
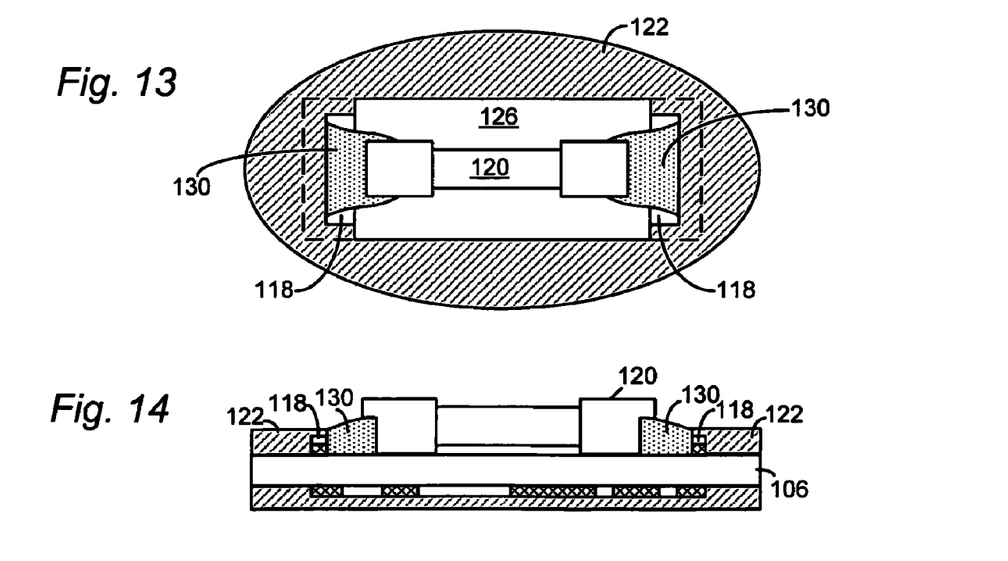
FIG. 13 is a top view of a substrate including a component surface mounted to the substrate according to the embodiment of FIG. 11.
FIG. 14 is a side view of a substrate including a component surface mounted to the substrate according to the embodiment of FIG. 11.

It is understood that the conductance pattern 108 and plating layer 118 may be formed in a wide variety of configurations other than U-shaped structures to affix to the ends and/or sides of component 120 according to embodiments of the present invention. For example, an alternative configuration is shown in FIGS. 11 through 14. As shown therein, the conductance pattern 108 and plating layer 118 are formed into generally rectangular-shaped pads on the substrate, spaced apart from each other a distance sufficient to receive a component 120 therebetween. The substrate 100 may be laminated with a solder mask 122 as described above to define the bare space 126. The component 120 may then be surface mounted to core 106 using solder paste 130 in an SMT step as shown in FIGS. 13 and 14 and as described above. As shown in FIG. 13, solder paste 130 in this embodiment may adhere to component 120 at the ends of component 120 and at the sides of component 120. However, in alternative embodiments, the solder paste 130 may be applied only to the ends of component 120 to affix and electrically connect the component 120 to the substrate.

In the embodiments described above, the component 120 is located on the substrate 100, and then the solder paste 130 is applied between the metal layers 108, 118 and the component 120. In a further embodiment of the present invention shown and described with respect to FIGS. 15 through 20, the order of these steps may be reversed so that the solder paste 130 is applied to the substrate and the component 120 is then positioned on the solder paste.

Figure 15:
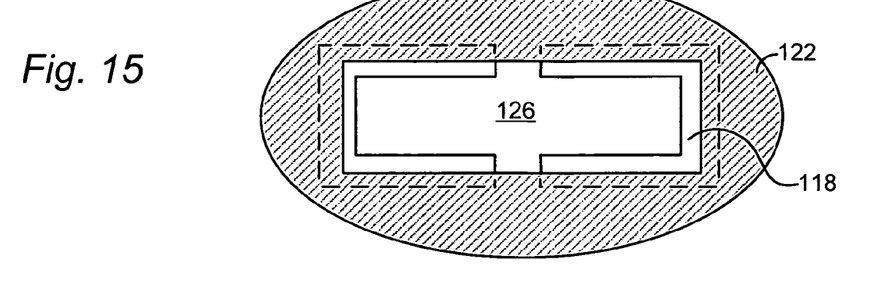
FIG. 15 is a top view of a substrate for receiving components surface mounted to the substrate including a solder mask according to embodiments of the present invention.
Figure 16:
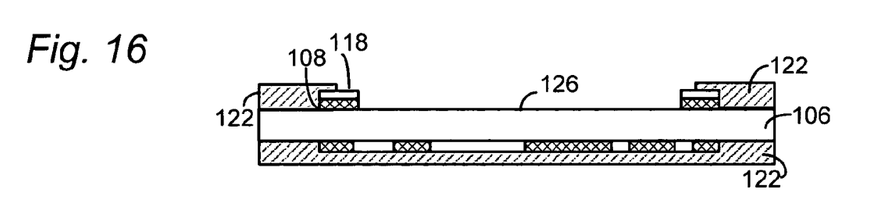
FIG. 16 is a side view of the substrate shown in FIG. 15.
Figure 17:
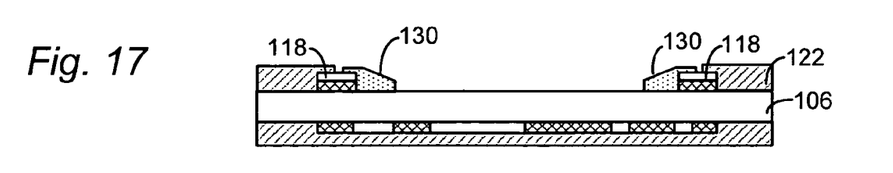
FIG. 17 is a side view of the substrate of FIG. 15, further including solder paste according to embodiments of the present invention.
Figure 18:
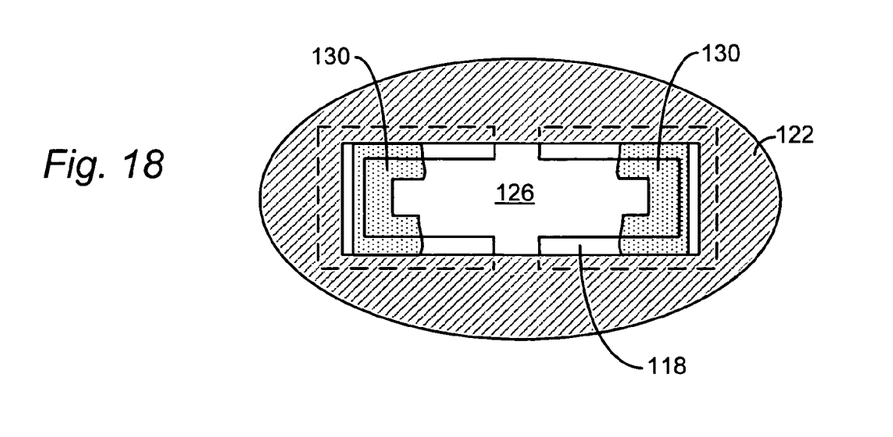
FIG. 18 is a top view of the substrate as in FIG. 15, further including solder paste according to embodiments of the present invention.
Figure 19:
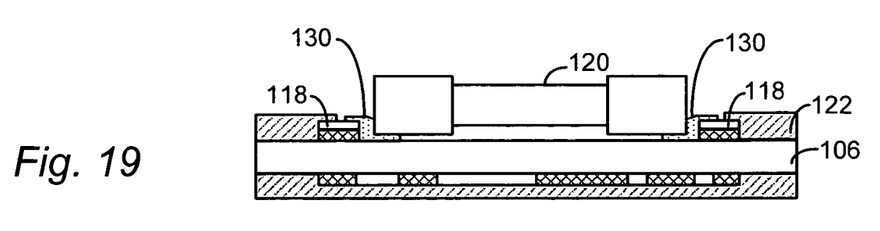
FIG. 19 is a side view of a substrate including a component surface mounted to the substrate according to embodiments of the present invention.
Figure 20:
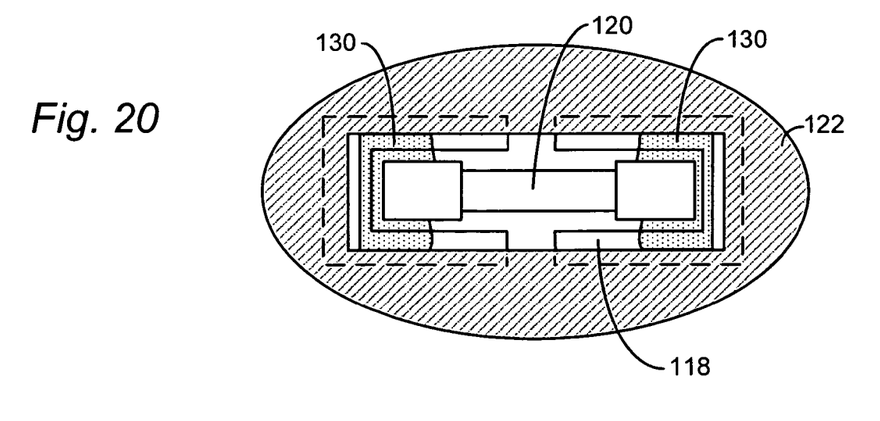
FIG. 20 is a top view of the substrate shown in FIG. 19.

In particular, as shown in FIGS. 15 and 16, the substrate may be fabricated as described above including metal layers 108, 118 and solder mask 122 defining bare space 126. Thereafter, the solder paste 130 may be applied onto the metal layer 118 and substrate 100 as shown in FIGS. 17 and 18. After the solder paste is applied, the component 120 may be mounted to the substrate on the solder paste as shown in FIGS. 19 and 20. The substrate may then be heated to reflow the solder paste and bond the component to the substrate. In the embodiment of FIGS. 15 through 20, there may or may not be some solder paste 130 remaining beneath the component 120 when the component is heated in the reflow process. Even if some solder paste remains beneath the component, the component may still be mounted to the substrate 100 with a lower profile than known in the prior art.

Figure 21:
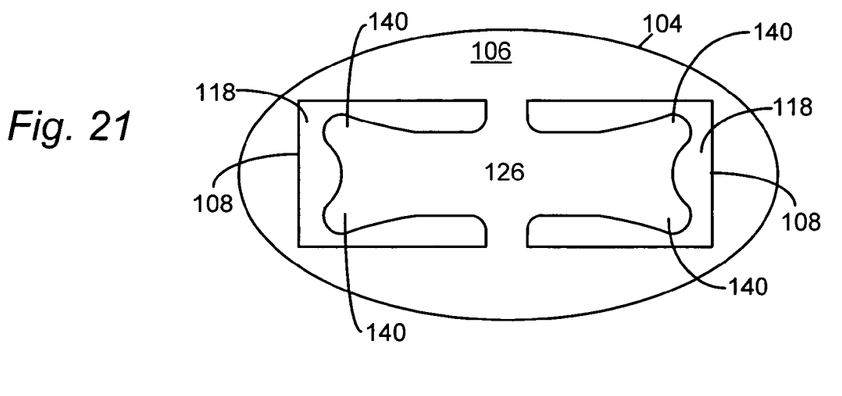
FIG. 21 is a top view of a substrate for receiving components surface mounted to the substrate according to a further alternative embodiment of the present invention.
Figure 22:
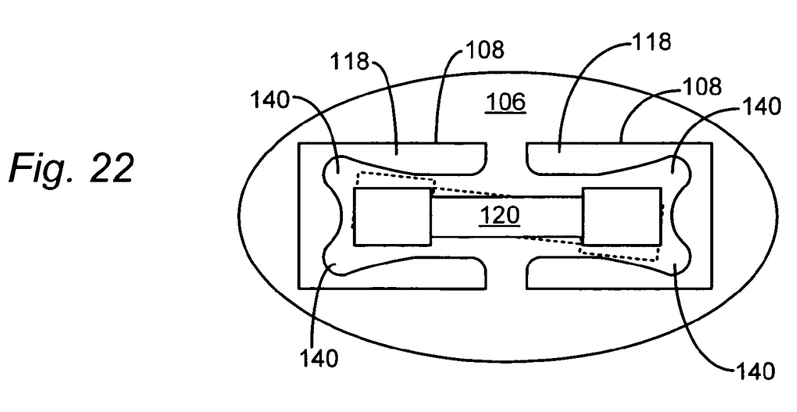
FIG. 22 is a top view of a substrate including a component surface mounted to the substrate according to the embodiment of FIG. 21.

A further example of a possible configuration of the conductance pattern 108 and plating layer 118 is shown in FIGS. 21 and 22. As shown therein, the pattern 108 and layer 118 may be defined on the substrate during the photolithography and etching processes with concave sections 140 at the boundaries of the bare space 126. As shown in FIG. 22, the concave sections 140 allow greater freedom of the orientation of the component 120 between the metals portions 108, 118. For example, the component 120 may be rotated slightly clockwise (as shown in phantom in FIG. 22) or counterclockwise from a horizontally and vertically aligned position of the component relative to the sections of metal portions 108, 118.

As described herein, the height of component 120 above the surface of the substrate 100 may be reduced by omitting three layers, each otherwise adding to the height of component 120 above the substrate: the first layer is the conductance pattern 108, the second layer is the plating layer 118, and the third layer is the solder paste layer 130. In alternative embodiments, it is further contemplated that only one or two of these layers may be omitted.

For example, the electrical contacts of component 120 may be mounted to a section of the substrate having the conductance pattern 108, but not plating layer 118 and no solder paste layer 130. In such an embodiment, a plated contact may be provided adjacent the end or sides of an electrical contact of the component 120 and the solder paste may electrically and physically couple the component by contacting the end and/or sides of the component as described above. As a further example, the electrical contacts of component 120 may be mounted to a section of the substrate having the conductance pattern 108 and plating layer 118, but no solder paste layer 130. In such an embodiment, the solder paste 130 may electrically and physically couple the component by contacting the end and/or sides of the component as described above.

Component 120 may be any type of component which may be surface mounted on a substrate according to an SMT process. In embodiments, component 120 may be a passive component, including for example a resistor, capacitor, inductor, jumper or other component. Component 120 may additionally or alternatively be any semiconductor package that is mounted to a substrate by SMT process steps. Such packages include, but are not limited to the following:

Small-Outline Integrated Circuit (SOIC)
Plastic Leaded Chip Carrier (PLCC)
Thin Small-Outline Package (TSOP)
Shrink Small-Outline Package (SSOP)
Thin Shrink Small-Outline Package (TSSOP)
Quarter-Size Small-Outline Package (QSOP)
Very Small-Outline Package (VSOP)
Small-Outline Transistor (SOT)
Low-Profile Quad Flat Package (LQFP)
Plastic Quad Flat-Pack (PQFP)
Ceramic Quad Flat-Pack (CQFP)
Thin Quad Flat Pack (TQFP)
Quad Flat Pack (QFN)
Power Quad Flat-Pack (PQFN)
Ball Grid Array (BGA)
Column Grid Array (CGA)
Ceramic Column Grid Array (CCGA)
Micro-BGA (µBGA)
Chip-On-Board (COB)
Chip-On-Flex (COF)
Leadframe Package (MLP)
Metric Quad Flat Pack (MQFP).

Figure 23:
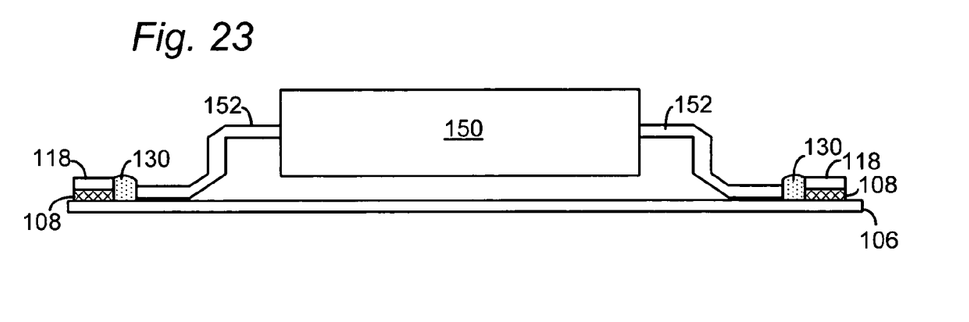
FIG. 23 is an edge view of a substrate including a component surface mounted to the substrate according to a further alternative embodiment of the present invention.
Figure 24:
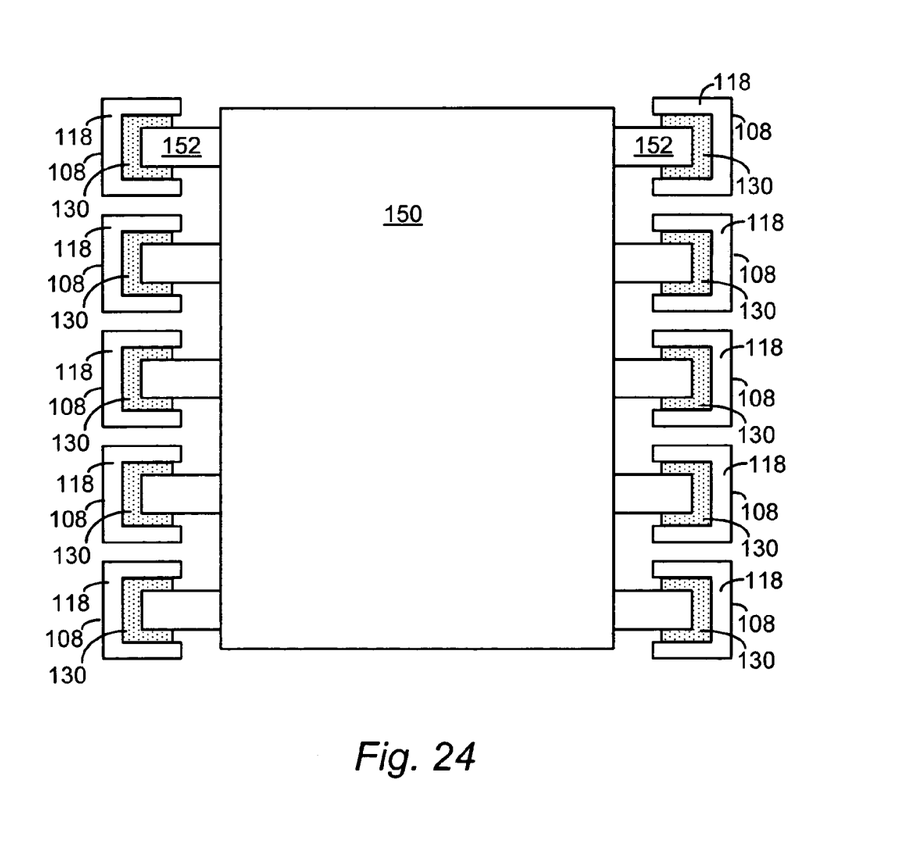
FIG. 24 is a top view of a substrate including a component surface mounted to the substrate according to the embodiment of FIG. 23.

An example where component 120 may be a surface mounted package is shown in edge view in FIG. 23 and top view in FIG. 24. As shown therein, a package 150 includes leads 152 mounted directly to core 106 of substrate 100. The leads 152 are physically and electrically connected to metal portions 108, 118 by solder paste 130, which solder paste 130 contacts leads 152 from the ends and/or sides of the leads. The boundaries between the leads 152 and metal portions 108, 118 may be as described above, and the width of the metal portions 108, 118 surrounding the leads 150 may be as described above. In addition to adhering to the ends and/or sides of leads 152, it is further contemplated that the solder paste 130 may be applied on top of portions of leads 152. Solder paste 130 may similarly be applied to the top portions of other components 120 described above.

Figure 25:
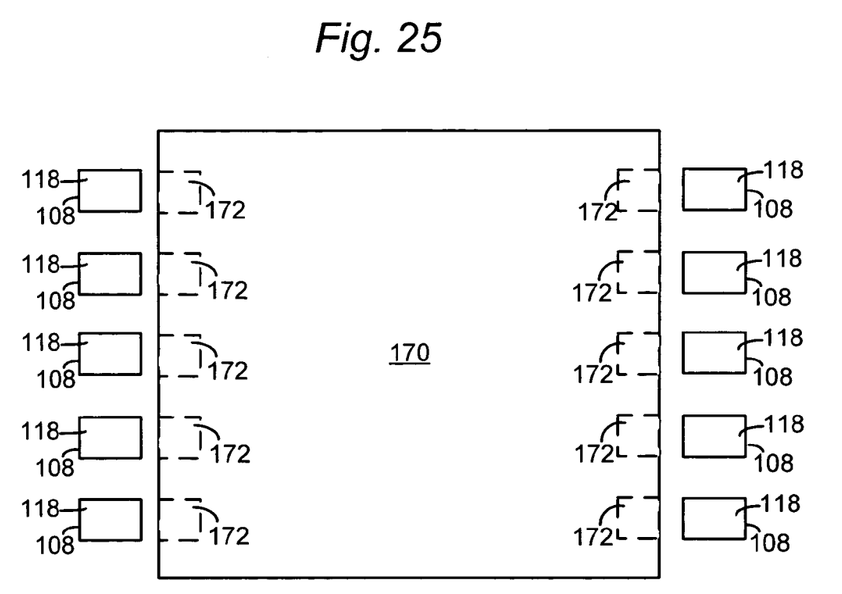
FIG. 25 is a top view of a substrate including a component surface mounted to the substrate according to a further alternative embodiment of the present invention.
Figure 26:
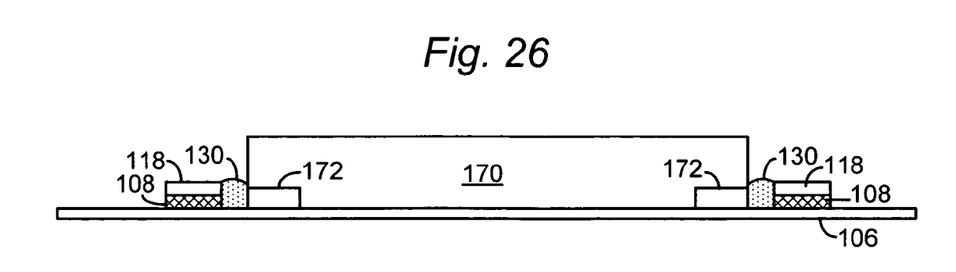
FIG. 26 is a side view of a substrate including a component surface mounted to the substrate according to the embodiment of FIG. 25.

Some semiconductor die have contact pads on a lower surface of the die, at edges of the die. In conventional systems, these contact pads are surface mounted to plated pads on a substrate. Referring now to the top view of FIG. 25 and the side view of FIG. 26, a component 120 may comprise a semiconductor die 170 mounted by SMT steps to a substrate 100 in accordance with the present invention. In such a system, the die may be mounted directly to core 106. Contact pads 172 on the lower surface of the die, at the edges of the die, may be affixed to metal portions 108, 118 at the sides of the die via solder paste 130 (shown in FIG. 26) as described above.

Figure 27:
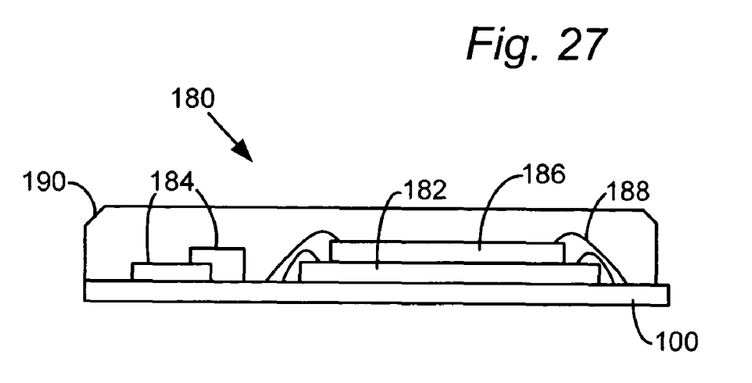
FIG. 27 is a cross-sectional view of a completed semiconductor package including a substrate for receiving components surface mounted to the substrate according to embodiments of the present invention.

Referring now to FIG. 27, there is shown a semiconductor package 180 including semiconductor die 182 and passive components 184, any or all of which may be mounted directly to the substrate core by SMT steps described above. FIG. 27 shows a second die 186 stacked on die 182, but embodiments may alternatively include a single die, and embodiments may alternatively include more than two die stacked in an SiP, MCM or other type of arrangement. While not critical to the present invention, the one or more die 182, 186 may be a flash memory chip (NOR/NAND), SRAM or DDT, and/or a controller chip such as an ASIC. Other silicon chips are contemplated.

Where not mounted according to the present invention, the one or more die 182, 186 may be mounted on the top surface of the substrate 100 in a known adhesive or eutectic die bond process, using a known die attach compound. Such die attach compounds are manufactured for example by Semiconductor Packaging Materials, Inc. of Armonk, N.Y. The one or more die 182, 186 may be electrically connected to conductive layer 108 by wire bonds 188 connecting to contact pads on the substrate in a known wire bond process. Alternatively, the contact pads for connecting to wire bonds 188 may be formed with a bare space 126 etched down to the core 106, and the wire bonds 188 may attach to such contact pads from their sides according to the present invention as described above.

After the various components are mounted on substrate 100, the substrate 100 and die 182, 186 may be encased within the molding compound 190 in a known encapsulation process to form the finished semiconductor die package 180. Molding compound 190 may be an epoxy such as for example available from Sumitomo Corp. and Nitto Denko Corp., both having headquarters in Japan. Other molding compounds from other manufacturers are contemplated. The molding compound 190 may be applied by various processes, including by transfer molding or injection molding techniques, to encapsulate the substrate 100, semiconductor die 182, 186 and passive components 184.

One or more of the components mounted to the substrate 100 in package 190 may be mounted directly to the core 106 of the substrate in accordance with embodiments of the present invention described above. As explained above, such components may be the semiconductor die 182, the passive components 184, and/or other surface mounted components. Mounting a component directly to the core 106 reduces the height of that component above the substrate in comparison to conventional surface mounting techniques, and may allow a reduction in the overall height of the encapsulated package 180.

Figure 28:
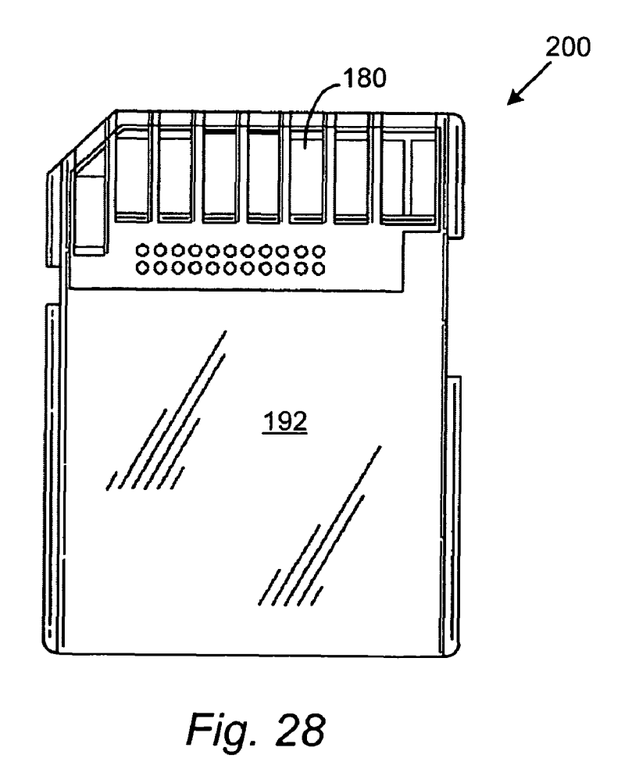
FIG. 28 is a top view of a flash memory device formed with a substrate according to embodiments of the present invention.

FIG. 28 illustrates package 180 enclosed within a lid 192 to form a flash memory device 200. It is understood that flash memory device 200 may be any of various devices including a secure digital (SD) card, a Compact Flash, a Smart Media, a Mini SD Card, an MMC, an xD Card, a Transflash memory card or a Memory Stick. Other devices are contemplated. It is further understood that package 180 may be used as a flash memory device 200 without being encased within a lid 192 in embodiments.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package, comprising:
    a substrate, including:
        a dielectric core, and
        first and second rows of flat, planar metal contacts formed into a conductance pattern on a surface of the dielectric core, the first and second rows of flat, planar metal contacts affixed to, and residing in a plane parallel to, the dielectric core, the first and second rows of flat, planar metal contacts together defining a bare space on the dielectric core in between the first and second rows;
    a semiconductor die supported on the core within the bare space and having a plurality of electrical contacts on a surface of the semiconductor die adjacent the core, the plurality of electrical contacts juxtaposed to the first and second rows of flat, planar metal contacts of the substrate; and
    solder paste, deposited directly on the dielectric core in the space between each juxtaposed pair of flat, planar metal contact on the substrate and electrical contact on the semiconductor die, for electrically coupling each juxtaposed pair of flat, planar metal contact on the substrate and electrical contact on the semiconductor die in a solder reflow process.

2. A semiconductor package as recited in claim 1, wherein the flat, planar metal contacts on the substrate include a layer having copper.

3. A semiconductor package as recited in claim 2, wherein the layer having copper is formed by a photolithography process.

4. A semiconductor package, comprising:
    a substrate, including:
        a dielectric core, and
        first and second rows of flat, planar metal contacts formed into a conductance pattern on a surface of the dielectric core, the first and second rows of flat, planar metal contacts residing in a plane parallel to the dielectric core, the first and second rows of flat, planar metal contacts together defining a bare space between the first and second rows of flat, planar metal contacts;
    a semiconductor die supported on the core within the bare space and having a plurality of electrical contacts the plurality of electrical contacts juxtaposed to the first and second rows of flat, planar metal contacts of the substrate; and
    solder paste, deposited directly on the dielectric core in the space between each juxtaposed pair of flat, planar metal contact on the substrate and electrical contact on the semiconductor die, for electrically coupling each juxtaposed pair of flat, planar metal contact on the substrate and electrical contact on the semiconductor die in a solder reflow process.

5. A semiconductor package as recited in claim 4, each contact of the first and second rows of contacts formed into a U-shaped section for surrounding the electrical contact of the semiconductor die on three sides of the electrical contact.

6. A semiconductor package as recited in claim 4, the first conductive area formed into a generally rectangular-shaped section for surrounding the electrical contact of the semiconductor die on one side of the electrical contact.

* * * * *